(12) United States Patent
Alfoqaha et al.

(10) Patent No.: US 11,903,170 B2
(45) Date of Patent: Feb. 13, 2024

(54) TEMPORARY STRUCTURAL BULKHEAD IN AN ELECTRONIC ENCLOSURE

(71) Applicant: International Business Machines Corporation, Armonk, NY (US)

(72) Inventors: Arshad Alfoqaha, Eden Prairie, MN (US); Kevin O'Connell, Rochester, MN (US); Mehdi Hamid Vishkasougheh, Rochester, MN (US); Eric J. Campbell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 17/644,562

(22) Filed: Dec. 16, 2021

(65) Prior Publication Data

US 2023/0200023 A1    Jun. 22, 2023

(51) Int. Cl.
*H05K 7/14* (2006.01)
*H05K 7/20* (2006.01)
*G06F 1/18* (2006.01)
*G06F 1/20* (2006.01)

(52) U.S. Cl.
CPC ......... *H05K 7/20736* (2013.01); *G06F 1/185* (2013.01); *G06F 1/20* (2013.01); *H05K 7/1492* (2013.01)

(58) Field of Classification Search
CPC .. H05K 7/20; H05K 7/20736; H05K 7/20145; H05K 7/14; H05K 7/1408; H05K 7/1424; H05K 7/1425; H05K 7/1427; H05K 7/1435; H05K 7/1461; H05K 7/1485; H05K 7/1487; H05K 7/1492; H05K 7/18; H05K 7/183; H05K 7/1491; H05K 1/0271; H05K 1/18; H05K 2201/2009; G06F 1/185; G06F 1/20; H01L 23/467
See application file for complete search history.

(56) References Cited

U.S. PATENT DOCUMENTS 4,348,963 A    9/1982  Dancy
4,358,233 A   11/1982  Morris
(Continued)

FOREIGN PATENT DOCUMENTS

EP    2101017 A2    9/2009
JP    3118711 U     2/2006
(Continued)

*Primary Examiner* — Adrian S Wilson
*Assistant Examiner* — Gage Crum
(74) *Attorney, Agent, or Firm* — Grant M. McNeilly

(57) ABSTRACT

A server includes a printed circuit board (PCB), an electronic component connected to the printed circuit board, and a chassis connected to the PCB. The chassis includes a first end with a first aperture configured to allow airflow into the server, a second end with a second aperture configured to allow the airflow out of the server after having passed across the electronic component, and a temporary bulkhead that is movable between a deployed position and a stowed position, wherein in the deployed position, the temporary bulkhead is connected to the PCB and extends across the server in a path of the airflow, and wherein in the stowed position, the temporary bulkhead is disconnected from the PCB and is positioned to open the path of the airflow.

20 Claims, 6 Drawing Sheets

(56) References Cited

U.S. PATENT DOCUMENTS

| | | | | |
|---|---|---|---|---|
| 4,988,577 | A * | 1/1991 | Jamieson | H05K 1/0271 428/596 |
| 5,186,377 | A * | 2/1993 | Rawson | B23K 3/0676 361/752 |
| 5,198,279 | A * | 3/1993 | Beinhaur | H05K 1/0271 174/250 |
| 5,706,964 | A | 1/1998 | Podd | |
| 6,260,265 | B1 * | 7/2001 | Kownacki | H05K 1/0271 428/573 |
| 6,407,917 | B1 * | 6/2002 | Craft, Jr. | H01L 23/467 257/722 |
| 6,512,676 | B1 * | 1/2003 | Crapisi | H05K 7/1461 361/752 |
| 6,574,100 | B1 * | 6/2003 | Anderson | G06F 1/181 312/236 |
| 6,626,625 | B2 | 9/2003 | Nelson | |
| 6,880,243 | B2 * | 4/2005 | Ireland | H05K 7/1461 361/752 |
| 7,357,611 | B2 | 4/2008 | Faivre | |
| 7,760,498 | B2 * | 7/2010 | Shan | H05K 7/20563 361/695 |
| 7,854,652 | B2 | 12/2010 | Yates | |
| 9,098,256 | B2 * | 8/2015 | Yen | G06F 1/20 |
| 9,433,131 | B2 * | 8/2016 | Joko | H05K 7/20736 |
| 9,836,102 | B1 * | 12/2017 | Anderl | H05K 7/20736 |
| 10,398,046 | B2 | 8/2019 | Chen | |
| 10,624,233 | B1 * | 4/2020 | Huang | H05K 7/20727 |
| 10,653,040 | B1 * | 5/2020 | Wang | H05K 7/20727 |
| 10,856,409 | B1 * | 12/2020 | Chuang | H05K 1/028 |
| 2002/0141165 | A1 * | 10/2002 | Sims | H05K 7/1461 361/752 |
| 2008/0011187 | A1 | 1/2008 | Halliar | |
| 2013/0058029 | A1 | 3/2013 | Ootani | |
| 2013/0094140 | A1 * | 4/2013 | Yen | G06F 1/20 361/679.48 |
| 2014/0104783 | A1 * | 4/2014 | Yang | G06F 1/183 361/692 |
| 2016/0143178 | A1 * | 5/2016 | Wang | G06F 1/183 165/80.2 |
| 2018/0095508 | A1 * | 4/2018 | Yi | H05K 7/20163 |
| 2019/0116688 | A1 * | 4/2019 | Chu | G06F 1/203 |
| 2019/0335616 | A1 | 10/2019 | Anderl | |
| 2020/0146186 | A1 | 5/2020 | Fotouh | |
| 2020/0284088 | A1 | 9/2020 | Neugebauer | |
| 2020/0324965 | A1 | 10/2020 | Joyce | |
| 2023/0148257 | A1 * | 5/2023 | Chia | H05K 7/2039 361/679.49 |

FOREIGN PATENT DOCUMENTS

| | | | |
|---|---|---|---|
| JP | 2016162806 A * | 9/2016 | H05K 7/20 |
| WO | 1996014236 A1 | 5/1996 | |

* cited by examiner

TEMPORARY STRUCTURAL BULKHEAD IN AN ELECTRONIC ENCLOSURE

BACKGROUND

The present disclosure relates to computer servers, and more specifically, to bulkhead structures for computer servers.

Within a datacenter, there can be many server racks that each include several computer servers. In traditional systems, the servers are supported on two opposite sides, which leaves the centers of the servers unsupported by the server rack. During transportation and installation of a server rack, the assembly is at risk of being dropped. This would subject the servers to a temporary but relatively high downward force. This can cause the servers to bend in the middle, which can damage the servers.

SUMMARY

According to an embodiment of the present disclosure, a server includes a printed circuit board (PCB), an electronic component connected to the printed circuit board, and a chassis connected to the PCB. The chassis includes a first end with a first aperture configured to allow airflow into the server, a second end with a second aperture configured to allow the airflow out of the server after having passed across the electronic component, and a temporary bulkhead that is movable between a deployed position and a stowed position, wherein in the deployed position, the temporary bulkhead is connected to the PCB and extends across the server in a path of the airflow, and wherein in the stowed position, the temporary bulkhead is disconnected from the PCB and is positioned to open the path of the airflow.

According to an embodiment of the present disclosure, a server rack includes a base, a plurality of rails extending from the base, and a server connected to the rails. The server includes a PCB, an electronic component connected to the printed circuit board, and a chassis connected to the PCB, wherein the chassis includes a temporary bulkhead that is movable between a deployed position and a stowed position, wherein in the deployed position, the temporary bulkhead is connected to the PCB and extends across the server in a path of airflow passing across the electronic component, and wherein in the stowed position, the temporary bulkhead is disconnected from the PCB and is positioned to open the path of the airflow.

DETAILED DESCRIPTION

Figure 1:
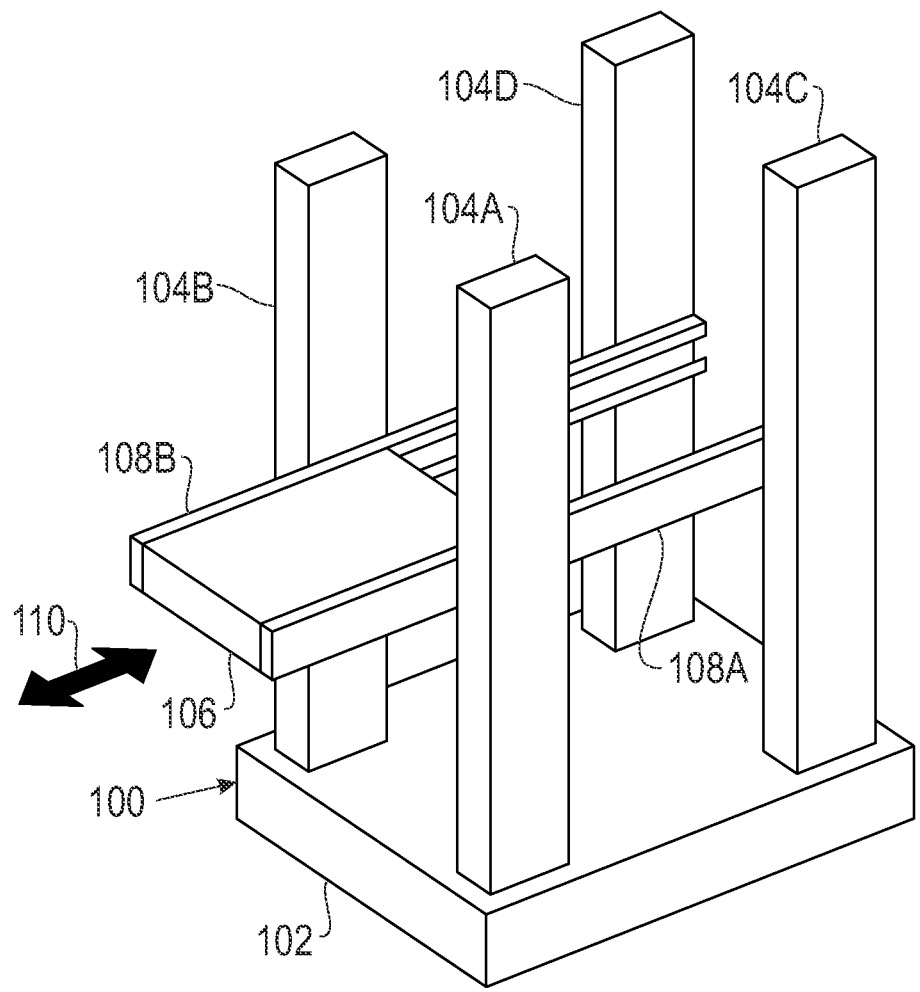
FIG. 1 is a perspective view of a server rack, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary components at the interface of the two elements.

FIG. 1 is a perspective view of server rack 100. In the illustrated embodiment, server rack 100 comprises base 102 and rails 104A-104D (collectively, "rails 104") extending upwards therefrom. Rails 104A-104D are parallel to one another and support a stack of servers 106 (although only one server 106 is shown in FIG. 1). More specifically, server rack 100 includes slider 108A that is mounted to rails 104A and 104C and slider 108B that is mounted to rails 104B and 104D (collectively, "sliders 108"). Sliders 108 are connected to server 106 on opposing sides. Sliders 108 can extend (as is shown in FIG. 1) and retract along direction 110, although during normal installation and operation, sliders 108 are retracted such that server 106 is predominantly positioned within the perimeter of rails 104.

Figure 2:
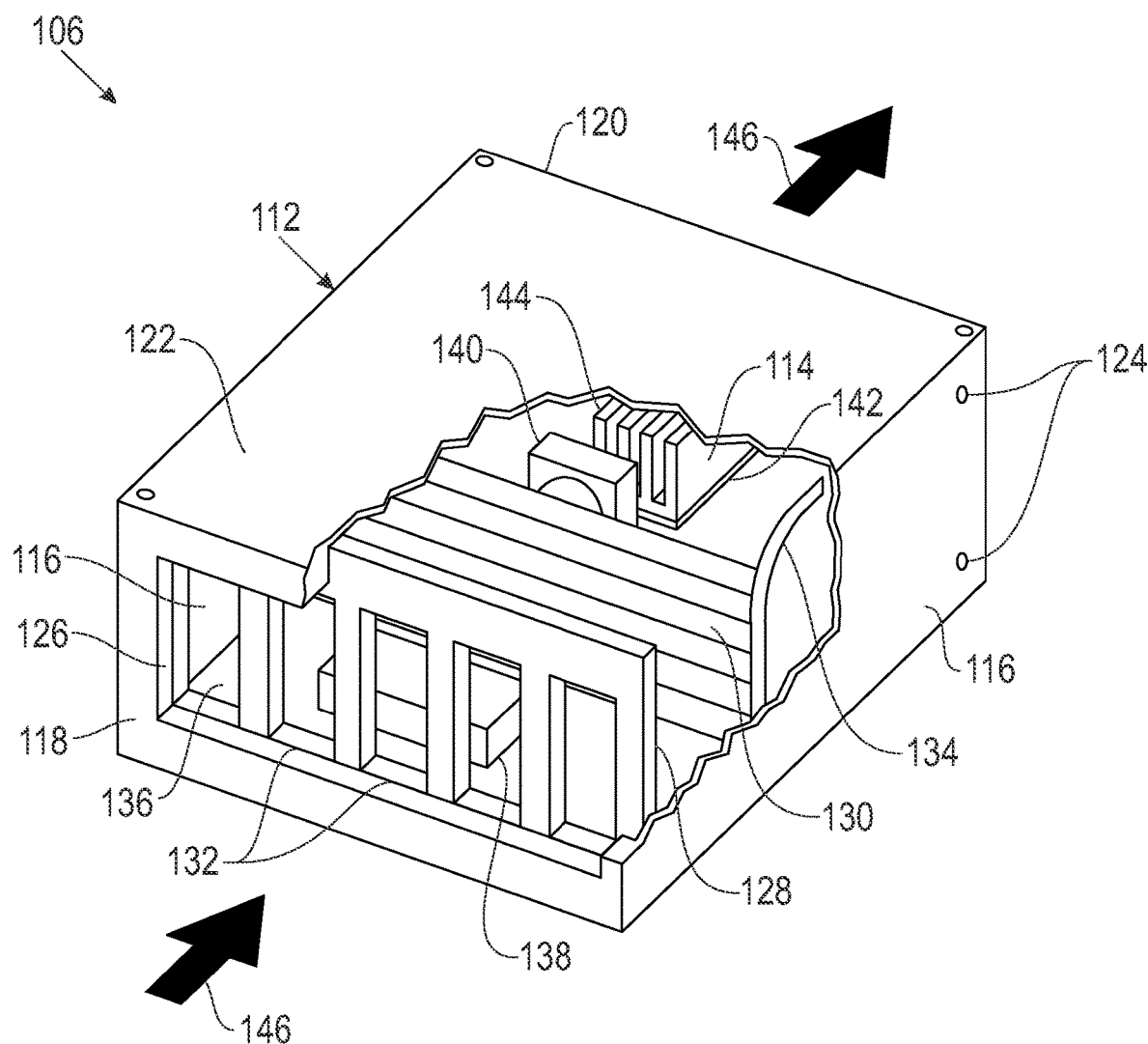
FIG. 2 is a perspective, cut-away view of a server, in accordance with an embodiment of the present disclosure.

FIG. 2 is a perspective, cut-away view of server 106. In the illustrated embodiment, server 106 comprises chassis 112 and electronics 114. Chassis 112 comprises five walls that are fastened together, specifically sides 116, front 118, rear 120, and cover 122. Sides 116 each include a plurality of mounting features 124 (e.g., threaded holes) to connect with rails 104 (shown in FIG. 1). Front 118 includes aperture 126 and rear 120 also includes an aperture (although it is not visible in FIG. 1) to allow for cooling airflow through server 106. Chassis 112 further comprises a plurality of stiffening members that extend across server 106, specifically bulkheads 128 and 130. Bulkheads 128 and 130 are connected to sides 116 and can also be connected to front 118, rear 120, and/or cover 122. While bulkhead 128 includes a plurality of apertures 132 to allow for cooling airflow through server 106, bulkhead 130 is stowable to allow for cooling airflow through server 106 (although bulkhead 130 is shown in the deployed position in FIG. 2). Chassis 112 further includes tracks 134 on each side 116 (although only one is visible in FIG. 2) to allow bulkhead 130 to be moved from the deployed position to the stowed position.

In the illustrated embodiment, electronics 114 includes printed circuit board (PCB) 136, hard drive 138, fan 140, processor 142, and heat sink 144. Electronic components, such as hard drive 138, fan 140, and processor 142, are mounted to and selectively electrically connected via PCB 136, and heat sink 144 is mounted on processor 142. PCB 136 extends along the bottom of chassis 112 and is connected to bulkheads 128 and 130 (when bulkhead 130 is deployed) and can also be connected to sides 116, front 118, and/or rear 120. Having PCB 136 connected to bulkheads 128 and 130 stiffens PCB 136 since there is no separate floor to chassis 112.

More specifically, server 106 is only connected to server rack 100 (shown in FIG. 1) at sides 116, so the center of server 106 is subject to a bending load due to gravity. This load can be greatly increased in the situation where server rack 100 is dropped, for example, during transportation or installation of server rack 100. Such a load would urge PCB 136 to bend with the maximum deflection being along a centerline of PCB 136 that runs front to back. However, bulkheads 128 and 130 structurally support PCB 136 so that PCB 136 maintains its shape, avoiding damage during high-load events. Therefore, during transportation of server rack 100, bulkhead 130 can be deployed to increase the stiffness of server 106. After installation of server 106 in server rack 100, bulkhead 130 can be moved to the stowed position (shown in FIG. 3B) by a user. This allows fan 140 to force air through server 106, as indicated by arrows 146, to cool electronics 114.

Figure 3A:
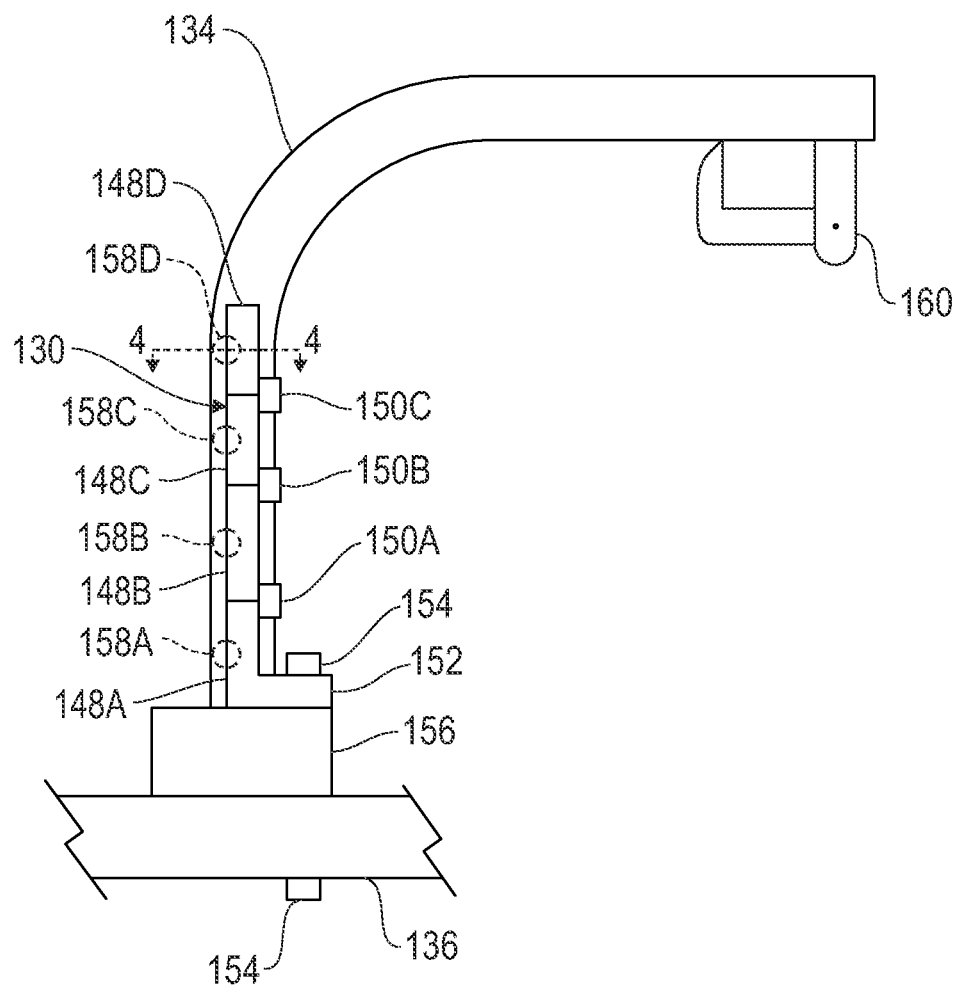
FIG. 3A is a side view of a temporary bulkhead in a deployed position, in accordance with an embodiment of the present disclosure.

FIG. 3A is a side view of bulkhead 130 in a deployed position. In the illustrated embodiment, bulkhead 130 comprises a plurality of segments 148A-148D (collectively "segments 148") that are connected by hinges 150A-150C (collectively "hinges 150"), respectively, wherein all of hinges 150 are on the same side of bulkhead 130 and flex in the same direction. Segment 148A includes foot 152, through which fastener 154 can pass. In the illustrated embodiment, fastener 154 connects bulkhead 130 to footer 156, and footer 156 is connected to PCB 136, for example, using fasteners (not shown).

While only one of each of hinges 150A-150C and fastener 154 is visible in FIG. 3A, there can be several of each of hinges 150A-150C and fastener 154 along the widths of segments 148 (e.g., four, five, or six), respectively. Fastener (s) 154 can be accessed from underneath server 106 (shown in FIG. 2) or from the top, for example, by removing cover 122 (shown in FIG. 2). Furthermore, in some embodiments, footer 156 is absent and bulkhead 130 is fastened directly to PCB 136. Alternatively, there can be two footers 156, with one on each side of PCB 136.

In the illustrated embodiment, bulkhead 130 is slidably connected to tracks 134 at pegs 158A-158D (collectively "pegs 158") on either end of segments 148A-148D. While each end of each segment 148 includes only one peg 158, the number of pegs 158 can be increased, for example, to two pegs 158 per side of each segment 148. Pegs 158A-158D ensure that bulkhead 130 follows tracks 134 when being moved between the deployed position and the stowed position, and tracks 134 are curved such that bulkhead 130, when deployed, is perpendicular to bulkhead 130 when stowed. While each segment 148 is rigid, hinges 150 allow for segments 148 to negotiate the curvature of tracks 134 by allowing bulkhead 130 to bend front to back. However, hinges 150 structurally connect segments 148, preventing relative movement top-to-bottom of segments 148 with respect to one another (when bulkhead 130 is deployed). Furthermore, pegs 158 structurally connect segments 148 to tracks 134, preventing relative movement side-to-side of bulkhead 130 with respect to sides 116 (shown in FIG. 2). Thus, when bulkhead 130 is in the deployed position and is fastened to PCB 136, bulkhead 130 supports PCB 136. This can significantly reduce deflection of PCB 136 when under the aforementioned gravity and inertial loads (e.g., from drops).

Figure 3B:
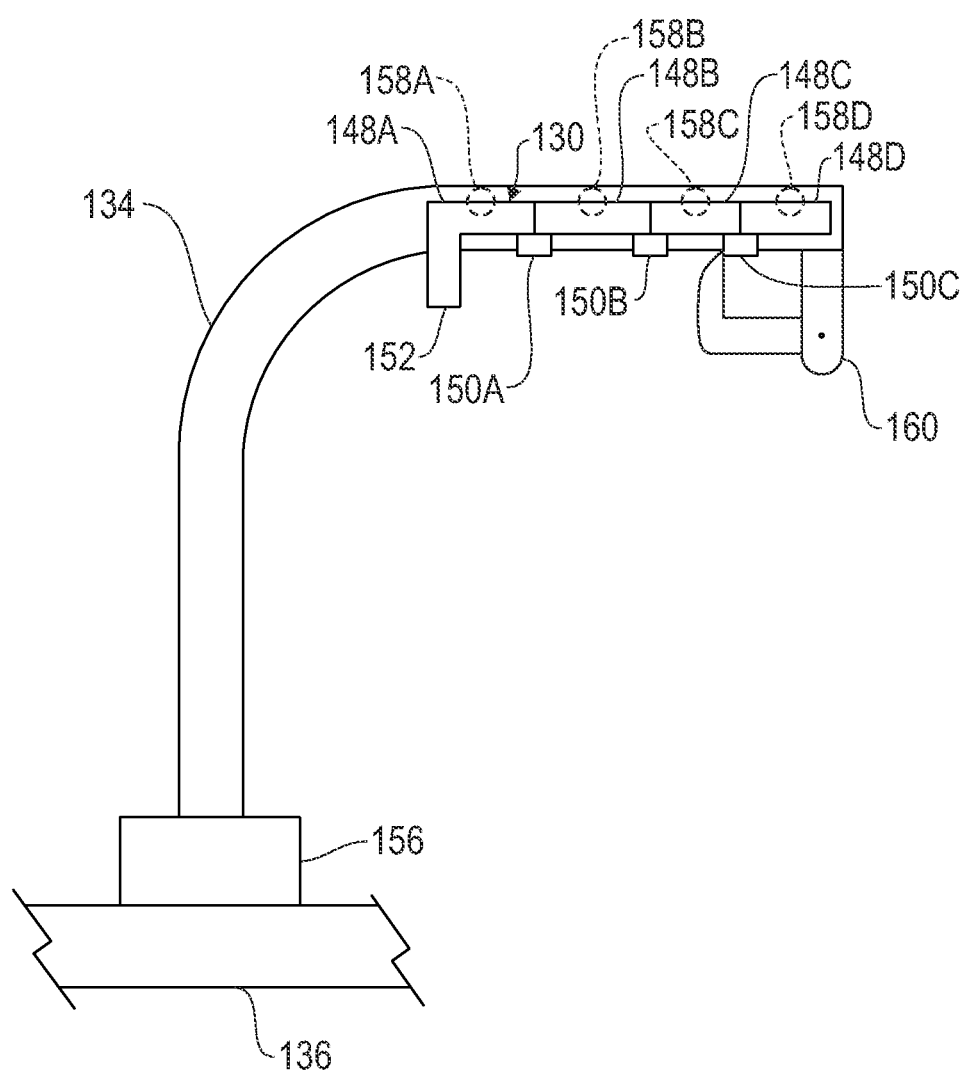
FIG. 3B is a side view of the temporary bulkhead in a stowed position, in accordance with an embodiment of the present disclosure.

FIG. 3B is a side view of bulkhead 130 in a stowed position. In the illustrated embodiment, bulkhead 130 has been disconnected from PCB 136 and has been moved up tracks 134. Bulkhead 130 is held in the stowed position by latch 160, which engages with hinge 150C. However, in other embodiments, bulkhead 130 is secured in the stowed position due to friction with tracks 134 or using fasteners. When stowed, bulkhead 130 is positioned parallel alongside cover 122, and essentially ceases its function as a stiffening member for PCB 136. However, this means that bulkhead 130 does not significantly impede the primary airflow path through server 106 and across the electronic components. In other words, the primary airflow path is open such that the airflow is still sufficient to cool the respective electronic components, even if there is some insignificant impedance that occurs through server 106. Because bulkhead 130 is only temporarily deployed, bulkhead 130 does not include apertures 132 that permanent bulkhead 128 (shown in FIG. 2) has, thereby increasing the rigidity of bulkhead 130.

Figure 4A:
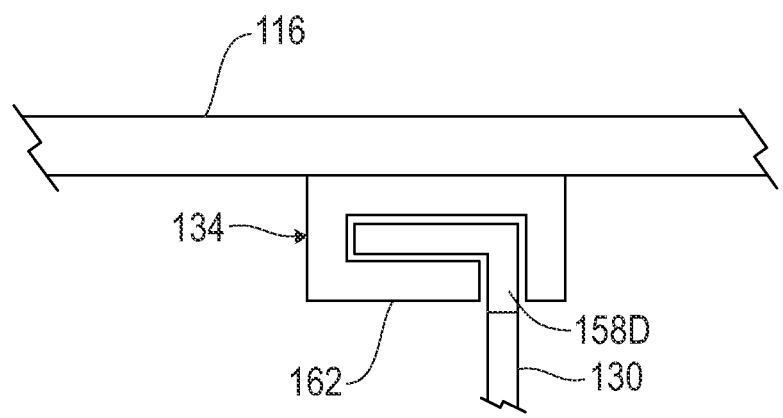
FIG. 4A is a cross-section view of the temporary bulkhead and a track therefor indicated by line 4-4 in FIG. 3A, in accordance with an embodiment of the present disclosure.

FIG. 4A is a cross-section view of bulkhead 130 and track 134 indicated by line 4-4 in FIG. 3A. In the illustrated embodiment, track 134 is connected to side 116 and has a G-shape that laterally constrains peg 158D from moving towards or away from side 116 while allowing bulkhead 130 to move locally parallel to track 134. The cantilevered portion of track 134, leg 162, can add rigidity to bulkhead 130 by resisting the bending resulting from the aforementioned gravity and inertial loads. In some embodiments, leg 162 is biased towards side 116, increasing friction with bulkhead 130 to prevent inadvertent sliding of bulkhead 130 out of the stowed position.

Figure 4B:
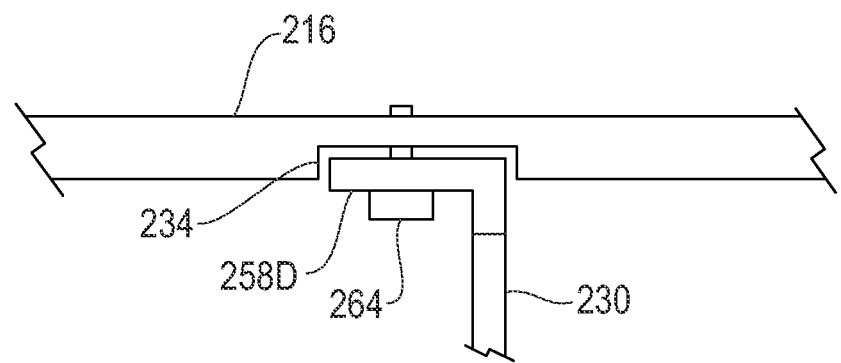
FIG. 4B is a cross-section view of an alternative temporary bulkhead and an alternative track therefor indicated by line 4-4 in FIG. 3A, in accordance with an embodiment of the present disclosure.

FIG. 4B is a cross-section view of an alternative bulkhead 230 and alternative track 234 indicated by line 4-4 in FIG. 3A. In the illustrated embodiment, track 234 is a trough in side 216 that laterally constrains peg 258D from moving towards side 216 while allowing bulkhead 230 to move locally parallel to track 234. While peg 258D is not itself constrained from moving away from side 216, the stiffness of segment 248D and the opposite peg (not shown) would prevent such movement. Furthermore, when bulkhead 230 is in the deployed (or stowed) position, it can be secured to side 116 by one or more fasteners 264 through pegs 258 (although only peg 258D is visible in FIG. 4B). Thereby, pegs 258 can add rigidity to bulkhead 230 by resisting the bending resulting from the aforementioned gravity and inertial loads. In some embodiments, pegs 258 are biased towards side 216, increasing friction with bulkhead 230 to prevent inadvertent sliding of bulkhead 230 out of the stowed position.

Figure 5A:
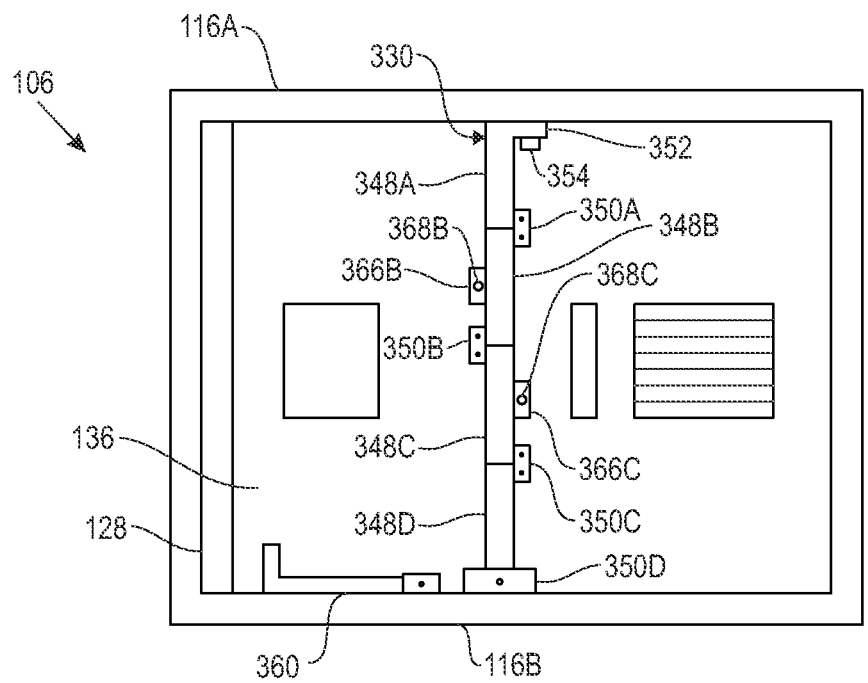
FIG. 5A is a bottom view of an alternative temporary bulkhead in a deployed position, in accordance with an embodiment of the present disclosure.

FIG. 5A is a top view of server 106 with cover 122 (shown in FIG. 2) removed, revealing alternative bulkhead 330 in a deployed position. In the illustrated embodiment, bulkhead 330 comprises a plurality of segments 348A-348D (collectively "segments 348") that are connected by hinges 350A-350D (collectively "hinges 350"), respectively. Hinges 350 alternate which side of bulkhead 330 they are on and flex in opposite directions to allow bulkhead 220 to fold. Segment 348A includes foot 352, through which fastener 354 can pass. In the illustrated embodiment, fastener 354 connects one end of bulkhead 330 to side 116A, and hinge 350D connects the other end of bulkhead 330 to side 116B.

While only one of each of hinges 350A-350D and fastener 354 is visible in FIG. 5A, there can be several of each of hinges 350A-350D and fastener 354 along the heights of segments 348 (e.g., four, five, or six), respectively. Fastener (s) 354 can be accessed from the inside of server 106, for example, by removing cover 122. In addition, bulkhead 330 can extend the entire height of the distance between PCB 136 and cover 122, or bulkhead 330 can extend only partway up (e.g., similar to that of bulkhead 130).

While bulkhead 130 (shown in FIG. 3A) has its hinges 150 oriented to bend along a horizontal axis, bulkhead 330 has its hinges 350 oriented to bend along a vertical axis. In the illustrated embodiment, when bulkhead 330 is deployed, it can be fastened to PCB 136. More specifically, segments 348B and 348C include tabs 366B and 366C to which fasteners 368B and 368C connect, respectively, although in some embodiments, segments 348A and 348D include their own tabs 366 and fasteners 368. In addition, hinges 350 structurally connect segments 348, preventing relative movement side-to-side of segments 348 with respect to one another (when bulkhead 330 is deployed) such that bulkhead 330 resists bowing downwards in the center. Thus, when bulkhead 330 is in the deployed position and is fastened to PCB 136, bulkhead 330 supports PCB 136. This can significantly reduce deflection of PCB 136 when under the aforementioned gravity and inertial loads (e.g., from drops).

Figure 5B:
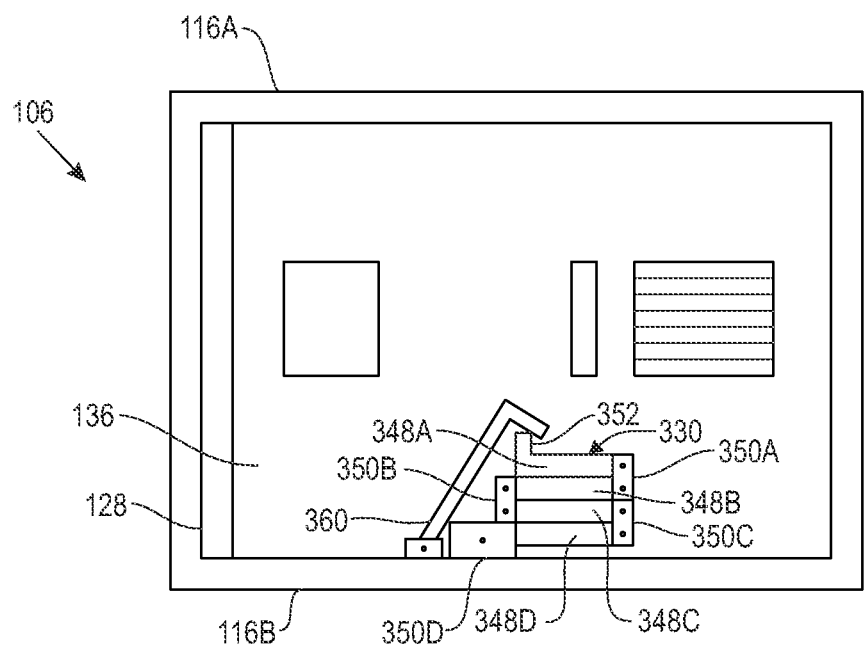
FIG. 5B is a bottom view of the alternative temporary bulkhead in a stowed position, in accordance with an embodiment of the present disclosure.

FIG. 5B is a top view of server 106 with cover 122 (shown in FIG. 2) removed, revealing alternative bulkhead 330 in a stowed position. In the illustrated embodiment, bulkhead 330 has been disconnected from PCB 136 and has been folded up. Bulkhead 330 is held in the stowed position by latch 360, which engages with foot 352. However, in other embodiments, bulkhead 330 is secured in the stowed position using a tab and a fastener to connect segment 348A to PCB 136 or cover 122 (shown in FIG. 2). When stowed, segments 348 are positioned parallel alongside side 116B, and bulkhead 330 essentially ceases its function as a stiffening member for PCB 136. However, this means that bulkhead 330 does not significantly impede the primary airflow path through server 106. Because bulkhead 330 is only temporarily deployed, bulkhead 330 does not include apertures 132 that permanent bulkhead 128 has, thereby increasing the rigidity of bulkhead 330.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A server comprising:
  a printed circuit board (PCB);
  an electronic component connected to the printed circuit board; and
  a chassis connected to the PCB, the chassis comprising:
    a first end with a first aperture configured to allow airflow into the server;
    a second end with a second aperture configured to allow the airflow out of the server after having passed across the electronic component;
    a temporary bulkhead that is movable between a deployed position and a stowed position, wherein;
      in the deployed position, the temporary bulkhead is connected to the PCB and extends entirely across the server in a path of the airflow to stiffen the chassis and structurally support the PCB; and
      in the stowed position, the temporary bulkhead is disconnected from the PCB, is positioned to open the path of the airflow, and remains in the server; and
    a latch configured to engage with the temporary bulkhead when the temporary bulkhead is in the stowed position to hold the temporary bulkhead in the stowed position.

2. The server of claim 1, wherein:
  the temporary bulkhead comprises a plurality of rigid segments connected by a plurality of hinges;
  the chassis further comprises a side extending from the first end to the second end; and
  each of the plurality of rigid segments is parallel alongside the side when the temporary bulkhead is in the stowed position.

3. The server of claim 2, wherein the plurality of hinges flexes in alternating, opposite directions.

4. The server of claim 2, wherein each of the plurality of hinges flexes in a same direction.

5. The server of claim 1, wherein:
  the chassis further comprises a cover over the PCB; and
  the temporary bulkhead is parallel alongside the cover when the temporary bulkhead is in the stowed position.

6. The server of claim 1, further comprising a fan connected to the PCB to force the airflow through the server.

7. The server of claim 1, wherein the chassis further comprises a permanent bulkhead that extends across the server in a path of the airflow and includes an aperture for the airflow.

8. The server of claim 1, further comprising a footer connected to the PCB and to the temporary bulkhead when the temporary bulkhead is in the deployed position.

9. The server of claim 1, wherein the chassis further comprises a track to which the temporary bulkhead is slidably connected such that the temporary bulkhead follows the track as the temporary bulkhead is moved between the deployed position and the stowed position.

10. A server rack comprising:
  a base;
  a plurality of rails extending from the base; and
  a server connected to the rails, wherein the server comprises:
    a printed circuit board (PCB);

an electronic component connected to the printed circuit board;

a chassis connected to the PCB, wherein:
- the chassis includes a temporary bulkhead that is movable between a deployed position and a stowed position;
- in the deployed position, the temporary bulkhead is connected to the PCB and extends entirely across the server in a path of airflow that passes across the electronic component to stiffen the chassis and structurally support the PCB; and
- in the stowed position, the temporary bulkhead is disconnected from the PCB, is positioned to open the path of the airflow, and remains in the server; and a latch configured to engage with the temporary bulkhead when the temporary bulkhead is in the stowed position to hold the temporary bulkhead in the stowed position.

11. The server rack of claim 10, wherein:
the server is connected to the plurality of rails at opposing sides of the server; and
the temporary bulkhead extends between the opposing sides when the temporary bulkhead is in the deployed position.

12. The server rack of claim 10, wherein the server further comprises:
a first end with a first aperture configured to allow the airflow into the server; and
a second end with a second aperture configured to allow the airflow out of the server.

13. The server rack of claim 10, wherein the server is one of a plurality of servers connected to the plurality of rails.

14. The server rack of claim 10, wherein the temporary bulkhead comprises a plurality of rigid segments connected by a plurality of hinges.

15. The server rack of claim 14, wherein:
the chassis further comprises a side extending from a first end of the chassis to a second end of the chassis; and
each of the plurality of rigid segments is parallel alongside the side when the temporary bulkhead is in the stowed position.

16. The server rack of claim 14, wherein each of the plurality of hinges flexes in a same direction.

17. The server rack of claim 14, wherein the plurality of hinges flexes in alternating, opposite directions.

18. The server rack of claim 10, wherein:
the chassis further comprises a cover over the PCB; and
the temporary bulkhead is parallel alongside the cover when the temporary bulkhead is in the stowed position.

19. The server rack of claim 10, wherein the chassis further comprises a permanent bulkhead that extends across the server in a path of the airflow and includes an aperture for the airflow.

20. The server rack of claim 10, wherein the chassis further comprises a track to which the temporary bulkhead is slidably connected such that the temporary bulkhead follows the track as the temporary bulkhead is moved between the deployed position and the stowed position.

* * * * *